United States Patent
Lee

(10) Patent No.: US 7,078,794 B2
(45) Date of Patent: Jul. 18, 2006

(54) CHIP PACKAGE AND PROCESS FOR FORMING THE SAME

(75) Inventor: I Tseng Lee, Taipei Hsien (TW)

(73) Assignee: VIA Technologies, Inc., Taipei Hsien (TW)

(*) Notice: Subject to any disclaimer, the term of this patent is extended or adjusted under 35 U.S.C. 154(b) by 22 days.

(21) Appl. No.: 10/250,289

(22) Filed: Jun. 20, 2003

(65) Prior Publication Data

US 2004/0164389 A1 Aug. 26, 2004

(30) Foreign Application Priority Data

Feb. 25, 2003 (TW) .............................. 92103870 A

(51) Int. Cl.
*H01L 23/22* (2006.01)
*H01L 23/24* (2006.01)

(52) U.S. Cl. ............ 257/687; 257/690; 257/693; 257/702; 257/703; 257/738; 257/789; 257/793

(58) Field of Classification Search ................ 257/687, 257/690, 693, 701–703, 737–738, 787–789, 257/793
See application file for complete search history.

(56) References Cited

U.S. PATENT DOCUMENTS 6,218,731 B1 * 4/2001 Huang et al. ................ 257/738
6,528,408 B1 * 3/2003 Kinsman ..................... 438/613

* cited by examiner

*Primary Examiner*—Long Pham
(74) *Attorney, Agent, or Firm*—Jiang Chyun IP Office

(57) ABSTRACT

A chip package structure comprising a substrate, a chip, a plurality of bumps, a plurality of conductive wires and an insulating material is provided. The substrate has a first surface and a corresponding second surface. The substrate has a slot that penetrates the substrate. The chip is attached to the first surface of the substrate in a position that covers the slot. The conductive wires pass through the slot such that one end of each conductive wire is attached to a contact point on the chip while the other end of the conductive wire is attached to a contact point on the second surface of the substrate. The insulating material fills the space between the chip and the substrate and the slot so that the conductive wires and the bumps are enclosed.

8 Claims, 12 Drawing Sheets

CHIP PACKAGE AND PROCESS FOR FORMING THE SAME

CROSS REFERENCE TO RELATED APPLICATIONS

This application claims the priority benefit of Taiwan application serial no.92103870, filed on Feb. 25, 2003.

BACKGROUND OF INVENTION

1. Field of Invention

The present invention relates to a chip package and process for forming the same. More particularly, the present invention relates to a technique for forming a chip package that combines wire-bond and flip-chip processes together.

2. Description of Related Art

In the semiconductor industry, layout diagrams of well-designed integrated circuits are submitted to a wafer plant for circuit fabrication. Patterned circuits are formed on wafers after performing a series of operations including, for example, doping, metal deposition, photolithography and etching processes and dielectric depositions. Thereafter, the wafers are sent to a packaging plant where the wafers are diced up into chips and assembled into individual packages. The chip and the substrate are electrically connected by using wires or bumps. After the packaging process, the chip and the electrical connection between the chip and the substrate are well protected.

FIG. 1 is a schematic cross-sectional view of a conventional wire-bond chip package. As shown in FIG. 1, the backside 112 of a chip 110 is attached to the upper surface 132 of a substrate 130 through silver epoxy 120. The chip 110 and the substrate 130 are electrically connected through a plurality of conductive wires 140. The chip 110 and the conductive wires 140 are completely enclosed by insulating material 150, which also protects the chip 110 and prevents any short-circuit between the conductive wires 140. In addition, a plurality of contacts 160 is directly attached to the bottom surface 134 of the substrate 130. Through the contacts 160, the substrate 130 is able to connect electrically with external circuits. The contacts 160 attached to the bottom surface 134 of the substrate 130 are conductive structures including, for example, solder balls, pins or electrode bumps.

In the aforementioned chip package 100, the average length of each piece of conductive wire 140 is rather long (mostly greater than 130 mil) and its diameter is rather small (mostly smaller than 1.2 mil). Hence, an impedance mismatch between the conductive wires 140 and the circuits inside the chip 110 or substrate 130 is quite common and often results in rapid signal decay. Ultimately, the access signals frequently contain errors. In addition, parasitic inductance/capacitance effect is especially serious when the chip performs a high frequency operation. In the presence of parasitic inductance/capacitance effect, signal reflections inside the chip package will be pervasive.

FIG. 2 is a schematic cross-sectional view of a conventional flip-chip package. The chip 210 is mounted on a top surface 232 of a substrate 230 via bumps 220 and electrically connected with the substrate 230. An insulating material 240 is dispensed between the chip 210 and the substrate 230 and envelops the bumps 220. Contacts 250 are mounted on a bottom surface 234 of the substrate 230 and electrically connect the substrate 230 to external circuits. The contacts 250 are conductive structures, such as, solder balls, pins or electrode bumps.

As shown in FIG. 2, the bumps 220 of the chip package 200 are positioned in a small area on the top surface 232 of the substrate 230 for positioning the chip 110. Hence, a large number of bonding pads 236 must be squeezed within a relatively small area on the top surface 232 of the substrate 230 for contacting with the bumps 220 electrically and mechanically. Furthermore, if the chip 210 has a relatively large surface area, completely filling the space between the chip 210 and the substrate 230 with the insulating material 240 will be difficult. In other words, voids may be created between the chip 210 and the substrate 230 and hence yield of the chip package may be lowered.

As shown in FIGS. 1 and 2, the bonding pads 136, 236 on the substrates 130, 230 for connecting electrically with the respective chips 110, 210 are located on the top surfaces 132, 232. Thus, there is a high concentration of circuits on the top surface 132, 232 of the substrates 130, 230. When these circuits transmit signals, cross talk between circuits will be pervasive. Furthermore, a low cost fabrication method such as lamination cannot be used to fabricate a substrate with high-density circuits. In other words, a built-up fabrication method having a high cost must be employed. Moreover, the bonding pads 136, 236 on the top surfaces 132, 232 of the substrates 130, 230 must connect electrically with the bonding pads 138, 238 on the bottom surfaces 134, 234 of the substrates 130, 230 through conductive vias (not shown). Therefore, signals must pass through the conductive vias in the substrates 130, 230 before arriving at the bottom surfaces 134, 234 of the substrates 130, 230. In other words, the substrate 130, 230 must provide a lot of space to accommodate these vias, rendering any further reduction of substrate areas difficult.

SUMMARY OF INVENTION

Accordingly, one object of the present invention is to provide a chip package and a method of forming the same for improving the electrical performance of the substrate and the electrical performance of the chip after forming a complete package.

A second object of this invention is to provide a chip package and a method of forming the same for reducing the production cost of the package by using a lamination technique to fabricate the substrate.

A third object of this invention is to provide a chip package and a method of forming the same for preventing the formation of voids when an insulating material is injected into the space between the chip and the substrate.

To achieve these and other advantages and in accordance with the purpose of the invention, as embodied and broadly described herein, the invention provides a chip package. The chip package has a structure comprising at least a substrate, a chip, a plurality of bumps, a plurality of conductive wires, an insulating material and a plurality of contacts. The substrate has a first surface and a corresponding second surface. The substrate has a slot passing through the first surface and the second surface. The substrate furthermore has a plurality of first substrate pads and a plurality of second substrate pads. The first substrate pads are formed on the first surface of the substrate close to and surrounding the slot. The second substrate pads are formed on the second surface of the substrate close to and surrounding the slot. The chip is attached to the first surface of the substrate at a location corresponding to the slot. The chip has an active surface with a plurality of first chip pads and a plurality of second chip pads thereon. The second chip pads are positioned in the central region of the active surface and the first chip pads are positioned in the peripheral region of the active surface. Each bump connects a first chip pad with a corresponding first substrate pad. Each conductive wire passes through the slot such that one end of the wire connects with a second chip pad while the other end of the wire connects with a corresponding second substrate pad. The insulating material occupies the slot and the space between the chip and the substrate such that the conductive wires and the bumps are also enclosed. The contacts are attached and electrically connected to the first surface of the substrate.

In addition, high frequency signals from the chip to the substrate or vice versa are transmitted through the first substrate pads and the first chip pads. Moreover, the substrate can be fabricated using a low-cost lamination technique.

The chip package according to this invention has a design that separates signal transmissions into a high frequency and a none high frequency category. The high frequency signals are transmitted from the chip through the bumps to the bottom surface of the substrate while the none high frequency signals (for example, power signals or ground signals) are transmitted via conductive wires passing through the slot to the top surface of the substrate. Hence, high frequency signals are directly routed to the contacts at the bottom surface of the substrate through a single patterned circuit layer rather than indirectly through the upper patterned circuit layers, the vias and the lower patterned circuit layers within the substrate to reach the contacts.

In brief, aside from shortening signal transmission paths, the chip package according to this invention is able to reduce the number of vias that need to be used for interconnecting circuit layers inside the substrate. In other Words, the overall area of the substrate can be reduced. In addition, both the first surface and the second surface of the substrate have substrate pads for connecting with the chip. With the substrate pads distributed on two separate surfaces of the substrate, circuits linking the substrate pads can be spread further apart. Consequently, the probability of cross talk or noise interference is greatly reduced. The decrease in circuit line density also permits the less costly lamination technique instead of the more costly layering build-up process to fabricate the substrate.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
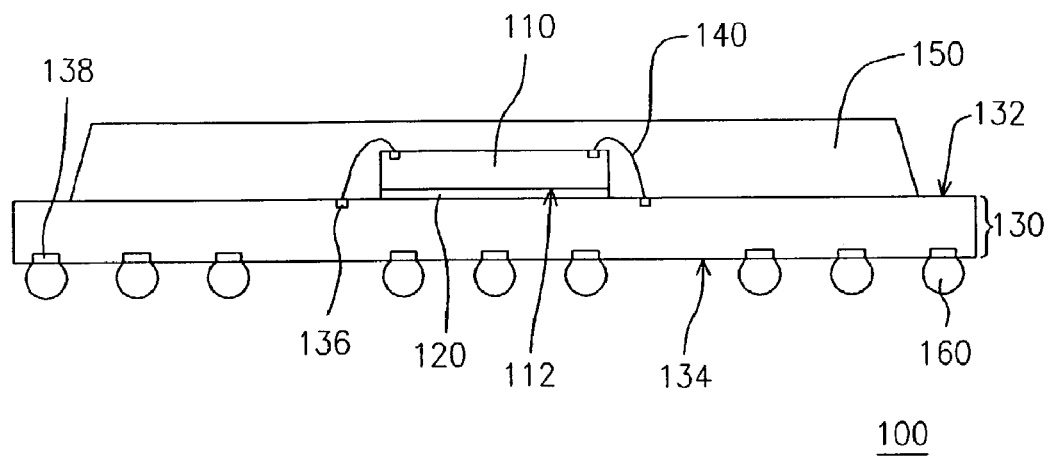
FIG. 1 is a schematic cross-sectional view of a conventional wire-bond chip package.
Figure 2:
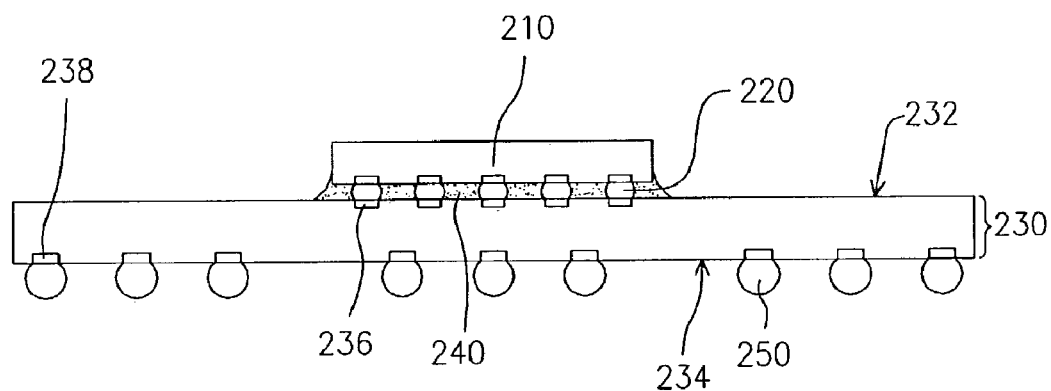
FIG. 2 is a schematic cross-sectional view of a conventional flip-chip package.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
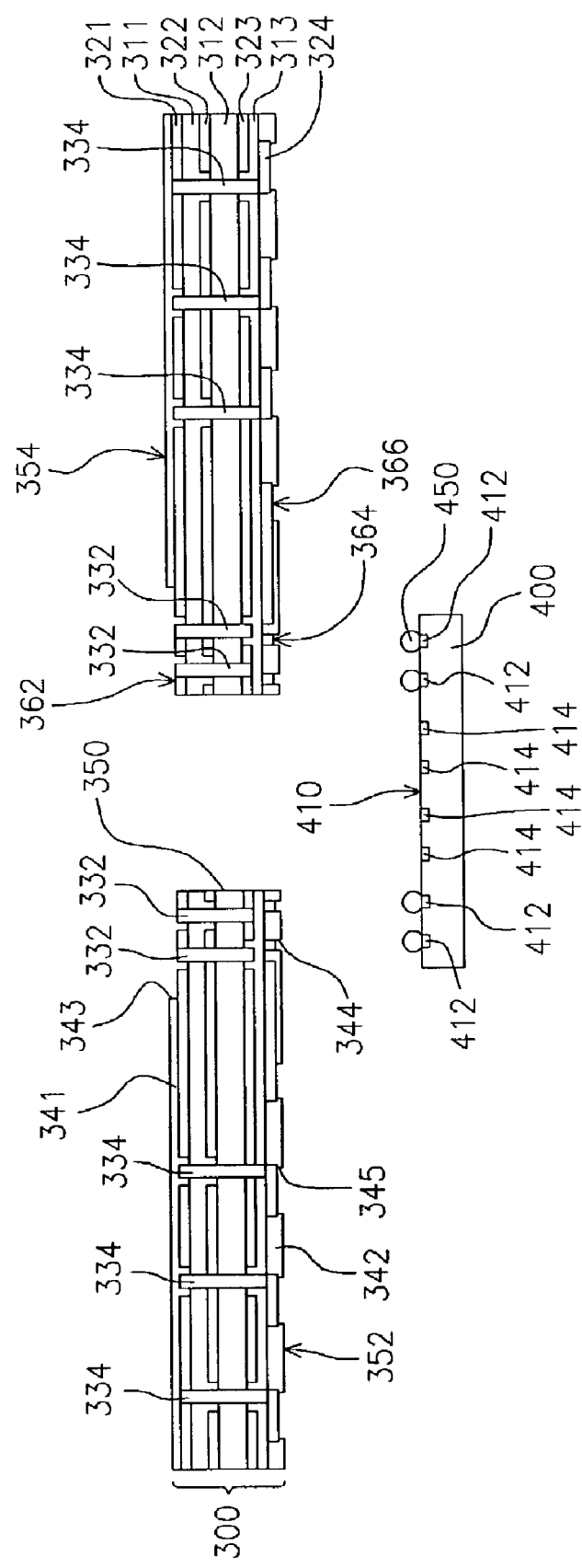
FIGS. 3A to 3F are schematic cross-sectional views showing the progression of steps for producing a chip package module according to a first preferred embodiment of this invention.

FIGS. 3A to 3F are schematic cross-sectional views showing the progression of steps for producing a chip package module according to a first preferred embodiment of this invention. As shown in FIG. 3A, a substrate 300 is provided. The substrate 300 comprises three dielectric layers 311, 312, 313 and four patterned metallic layers 321, 322, 323, 324. The patterned metallic layers 321, 322, 323, 324 are sequentially stacked with the dielectric layers 311, 312, 313 positioned between pairs of neighboring patterned metallic layers so that the patterned metallic layers 321, 322, 323, 324 are electrically isolated. Furthermore, the substrate 300 has conductive via plugs 332 and 334. The conductive via plugs 332 passes through the dielectric layers 311 and 312 so that the patterned metallic layers 321, 322 and 323 are electrically connected. The conductive via plugs 334 pass through the 311, 312 and 313 so that the patterned metallic layer 321, 322, 323 and 324 are electrically connected. The substrate 300 also has solder mask layers 341, 342 on the dielectric layer 311 and 313 that cover the patterned metallic layers 321 and 324. The solder mask layers 341 and 342 are formed over the first surface 352 and the second surface 354 of the substrate 300 respectively. The solder mask layer 341 has a plurality of openings 343 that exposes the patterned metallic layer 321 for forming substrate wire pads 362 on the second surface 354 of the substrate 300. The substrate wire pads 362 subsequently serve as bonding pads for connecting with corresponding conductive wires (not shown) from the chip 400. The solder mask layer 342 has a plurality of openings 344 that exposes the patterned metallic layer 324 for forming substrate bump pads 364 on the first surface 352 of the substrate 300. The substrate bump pads 364 subsequently serve as bonding pads for connecting with corresponding bumps 450 attached to the chip 400. The solder mask layer 342 also has a plurality of openings 345 that exposes the patterned metallic layer 324 for forming substrate contact pads 366 on the first surface 352 of the substrate 300. The substrate contact pads 366 subsequently serve as bonding pads for attaching the contact of a conductive structure (not shown) including, for example, a solder ball, a pin or an electrode bump. The substrate 300 also has a slot 350 that passes through the central region. The substrate bump pads 364 are formed on the first surface 352 around the slot 350. The substrate wire pads 362 are formed on the second surface 354 around the slot 350.

In this embodiment, the substrate 300 has a four-layered structure. However, the substrate can comprise any number of patterned metallic layers. Moreover, the substrate 300 can be fabricated using a lamination or a built-up process. If the lamination technique is used for fabricating the substrate 300, the production cost will be lowered.

The chip 400 comprises a plurality of chip bump pads 412 and a plurality of chip wire pads 414. The chip wire pads 414 are formed in the central region on the active surface 410 of the chip 400. The chip bump pads 412 are formed in the peripheral region on the active surface 410 of the chip 400. The active surface 410 of the chip 400 has a surface area larger than the sectional area of the slot 350 in the substrate 300. Before the chip 400 and the substrate 300 are bonded together, a plurality of bumps 450 are attached to the respective chip bump pads 414 by performing a printing or a plating process.

Figure 3B:
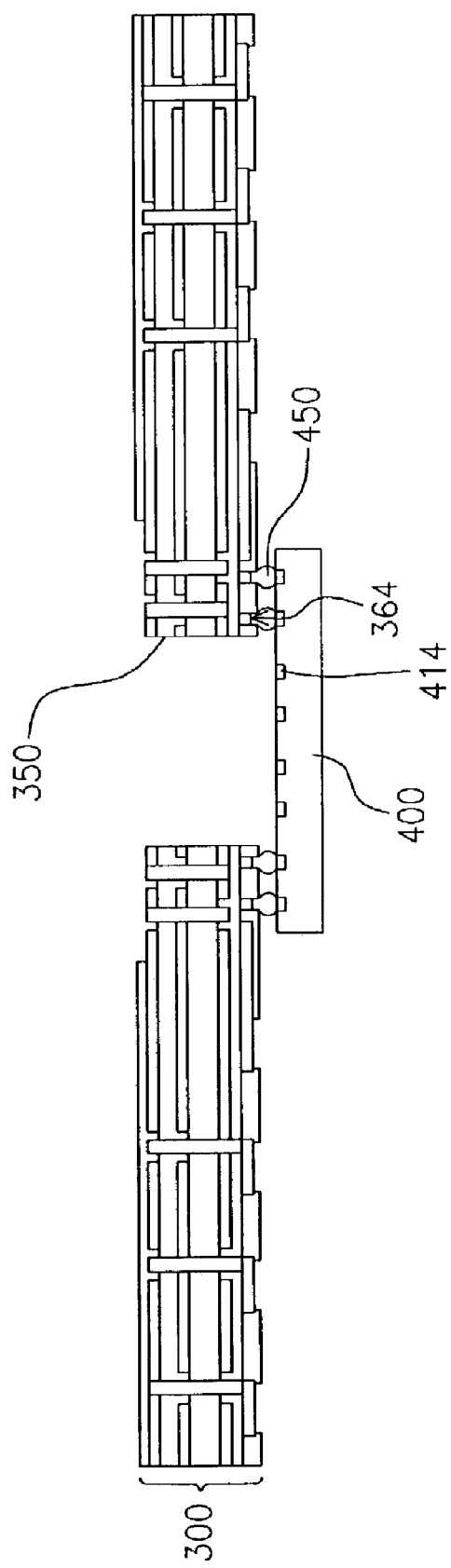

As shown in FIG. 3B, the chip 400 is bonded onto the first surface 410 of the substrate 300 to cover the slot 350. The bumps 450 on the chip 400 are attached to the substrate bump pads 364 on the substrate 300 and the chip wire pads 414 are located in an area corresponding to the slot 350 of the substrate 300.

Figure 3C:
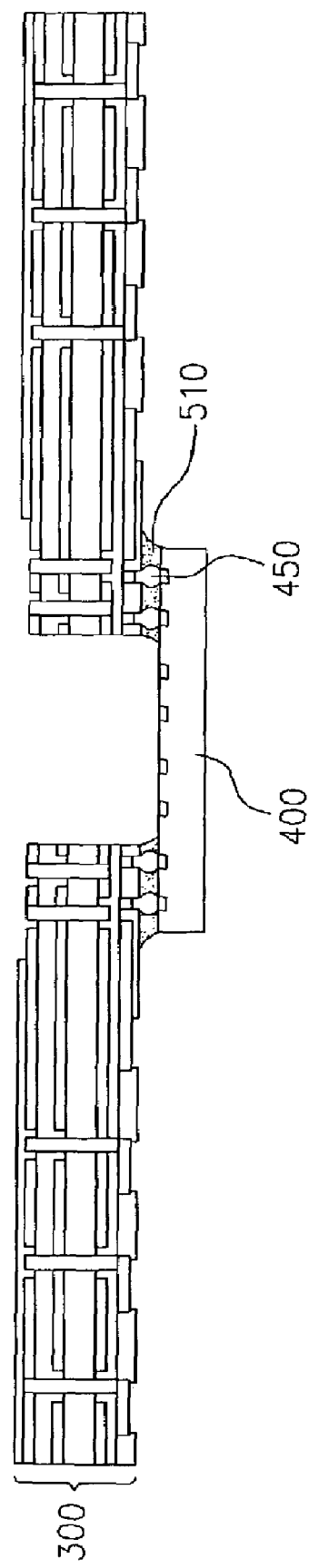

As shown in FIG. 3C, an underfilling process is performed to fill up the space between the chip 400 and the substrate 300 with an insulating material 510 so that all the bumps 450 are enclosed. Since the insulating material 510 are injected to fill only a small region, voids are rarely formed. Hence, process yield of the package will be improved.

Figure 3D:
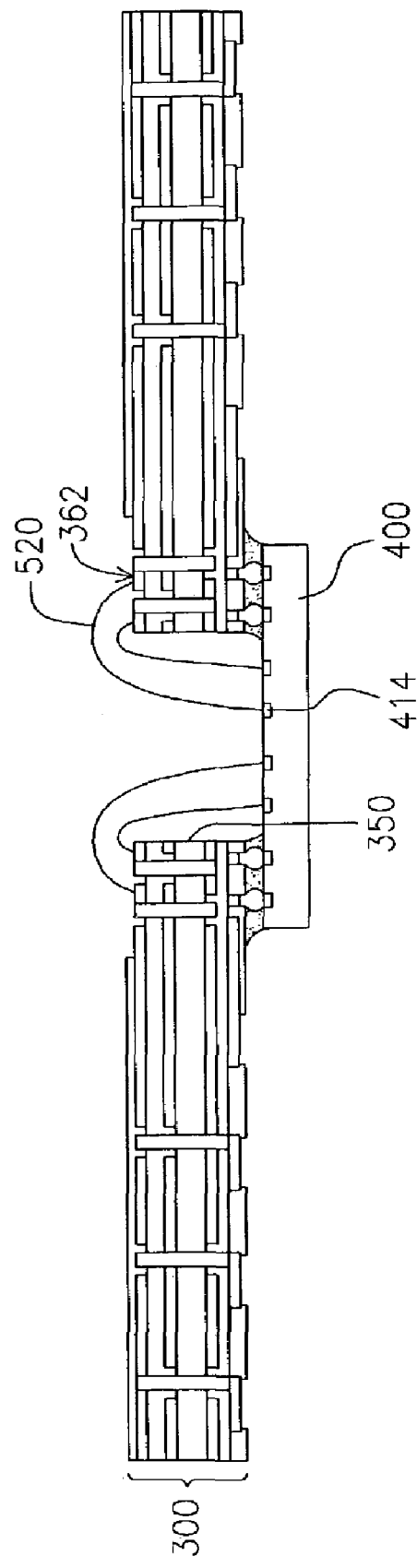

As shown in FIG. 3D, a plurality of conductive wires 520 are positioned by performing a wire bonding process. The conductive wires 520 pass through the slot 350 in the substrate 300 such that one end of each wire is attached to a chip wire pad 414 and the other end is attached to a corresponding substrate wire pad 362.

Figure 3E:
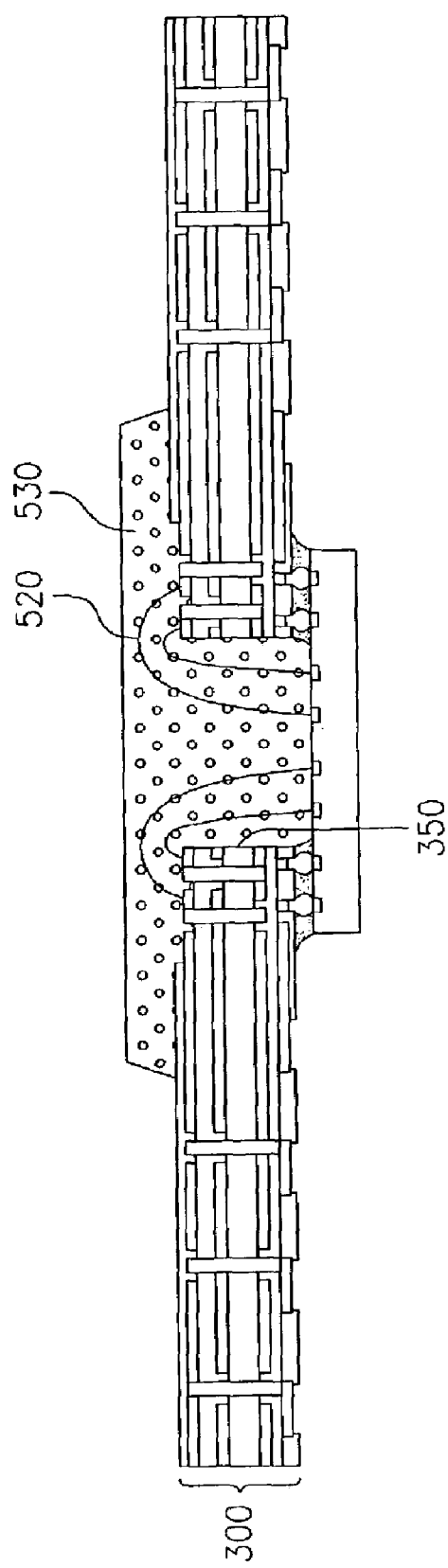

As shown in FIG. 3E, the slot 350 in the substrate 300 is filled so that the conductive wires 520 are enclosed by injecting another insulating material 530 in a packaging molding process.

Figure 3F:
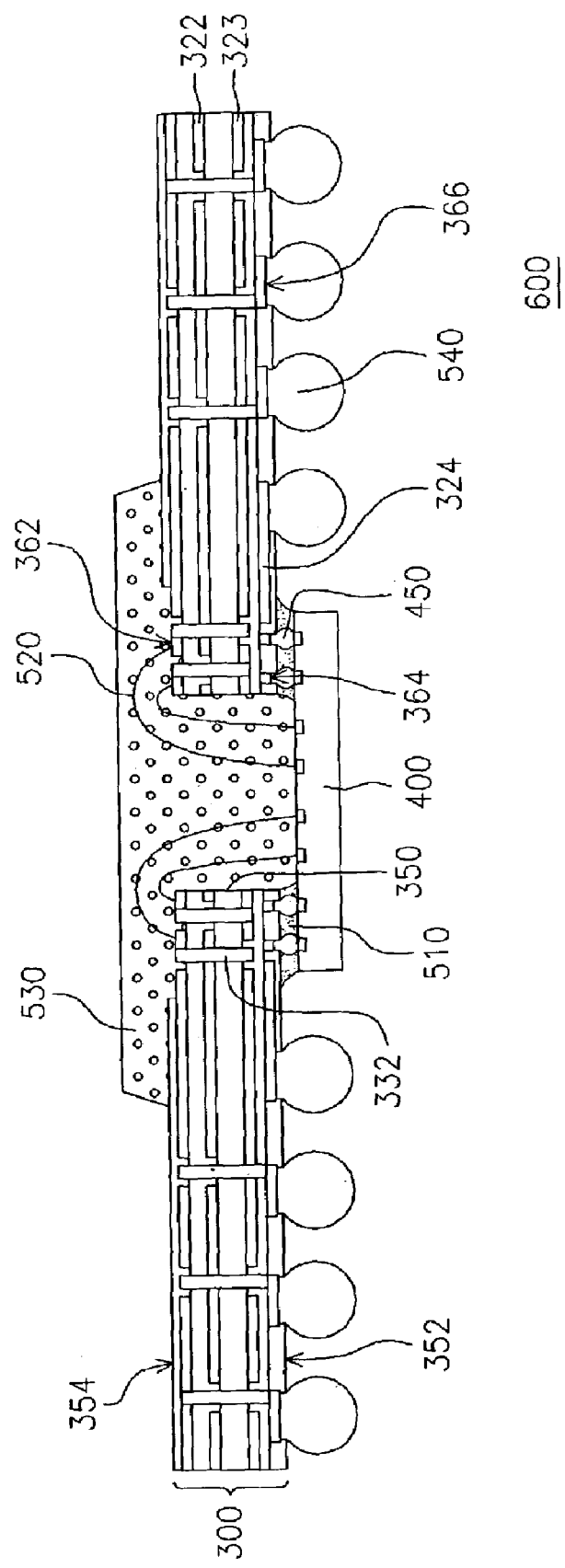

As shown in FIG. 3F, a plurality of contacts 540 are formed on the substrate pads 364 so that the substrate 300 is electrically connected to external circuits through the contacts 540. The contacts 540 are conductive structures including, for example, solder balls, pins or electrode bumps. Finally, a number of independent chip packages 600 are produced after performing a singulation process.

The chip package 600 in FIG. 3F has many outstanding electrical characteristics due to the following reasons: 1. High frequency signals can be transmitted through the bumps 450 while the none high frequency signals can be transmitted through the conductive wires 520. Furthermore, ground voltage or power voltage can be connected using the conductive wires 520. With this arrangement, high frequency signals are directly connected to the contacts 540 through the patterned circuit layer 324 so that there is no need to pass through any via plugs. Therefore, the number of via plugs embedded inside the substrate 300 can be reduced. When fewer number of via plugs are used, average length of routing paths inside the substrate 300 is reduced and hence the performance of the chip package 600 is improved. 2. With the reduction of via plugs and a few via plugs 332 not connecting to the patterned metallic layer 324, more space is retained for circuits layout at the patterned metallic layer 324. For example, more guard traces for absorbing or shielding noise can be designed within the patterned metallic layer 324. 3. The first surface 352 and the second surface 354 of the substrate 300 have substrate bump pads 364 and substrate wire pads 362 for connecting electrically with the chip 400. Hence, the circuits inside the substrate 300 do not have to be squeezed within a single surface. In other words, the routing wires that connect with the substrate wire pads 362 and the substrate bump pads 364 can have a low layout density inside the substrate 300. Consequently, cross talk and noise interference of the circuit wires inside the substrate 300 are minimized and the electrical performance of the chip package 600 is improved. 4. Any electrical property loss due to the formation of the slot 350 in the substrate 300 can be compensated by incorporating additional external passive components. For example, overall surface area of the patterned metallic layers 322 and 323 is reduced after the slot 350 is formed in the substrate 300.

Hence, the ultimate amount of parasitic capacitance that can be introduced between the patterned metallic layers 322 and 323 will be reduced considerably. Under such circumstances, the capacitance loss can be compensated by incorporating an external capacitance so that the impact resulting from a sudden surge of electric current is minimized.

Aside from the high density circuit layout within the patterned metallic layer 324 of the substrate 300, density of circuits within the patterned metallic layers 321, 322, 323 are relatively low. Thus, a low cost lamination method instead of a costly built-up process may be deployed to fabricate the substrate 300 of the chip package 600.

Figure 4:
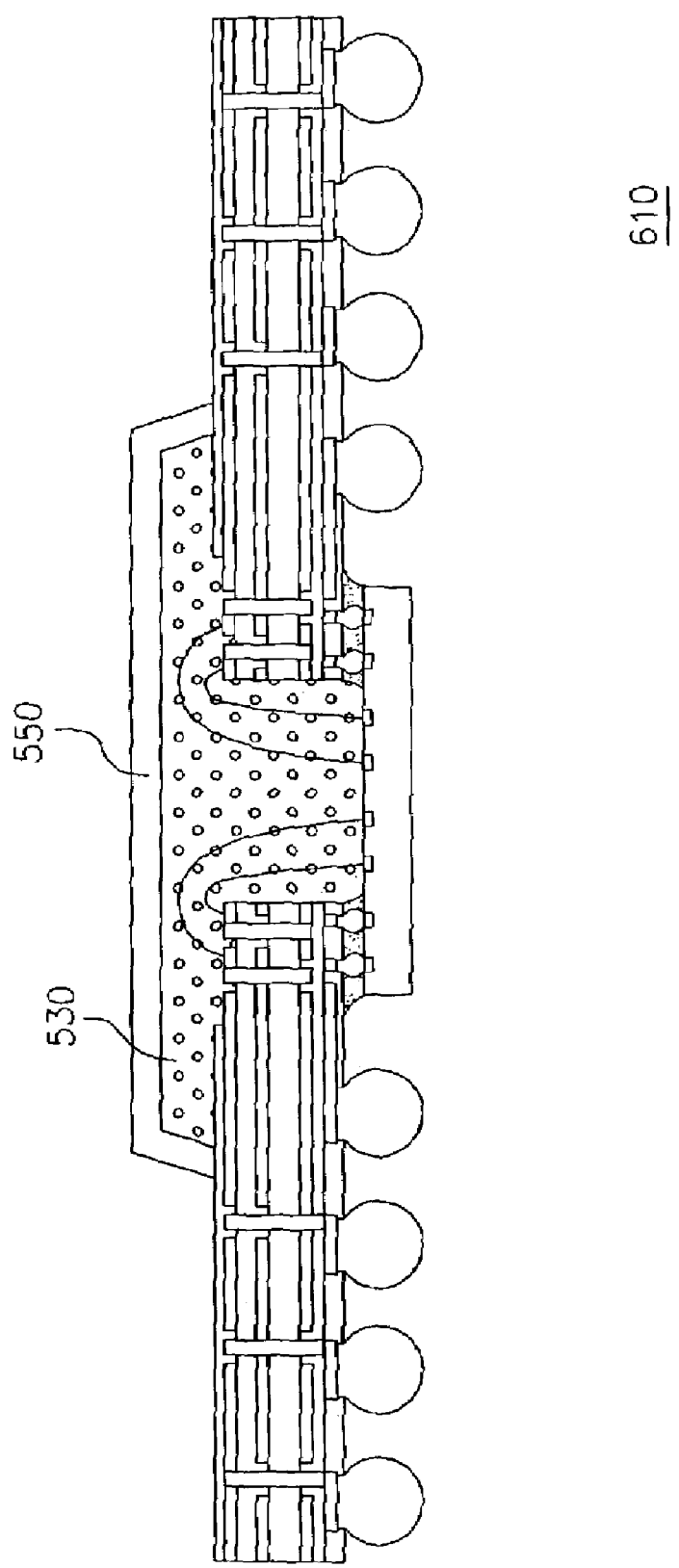
FIG. 4 is a schematic cross-sectional view of a chip package module according to a second preferred embodiment of this invention.

FIG. 4 is a schematic cross-sectional view of a chip package module according to a second preferred embodiment of this invention. As shown in FIG. 4, a heat sink 550 covers the insulating material 530 in a chip package module 610 so that heat within the insulating material is rapidly dissipated. The heat sink 550 is fabricated using a material having a high thermal conductivity such as a metal.

Figure 5:
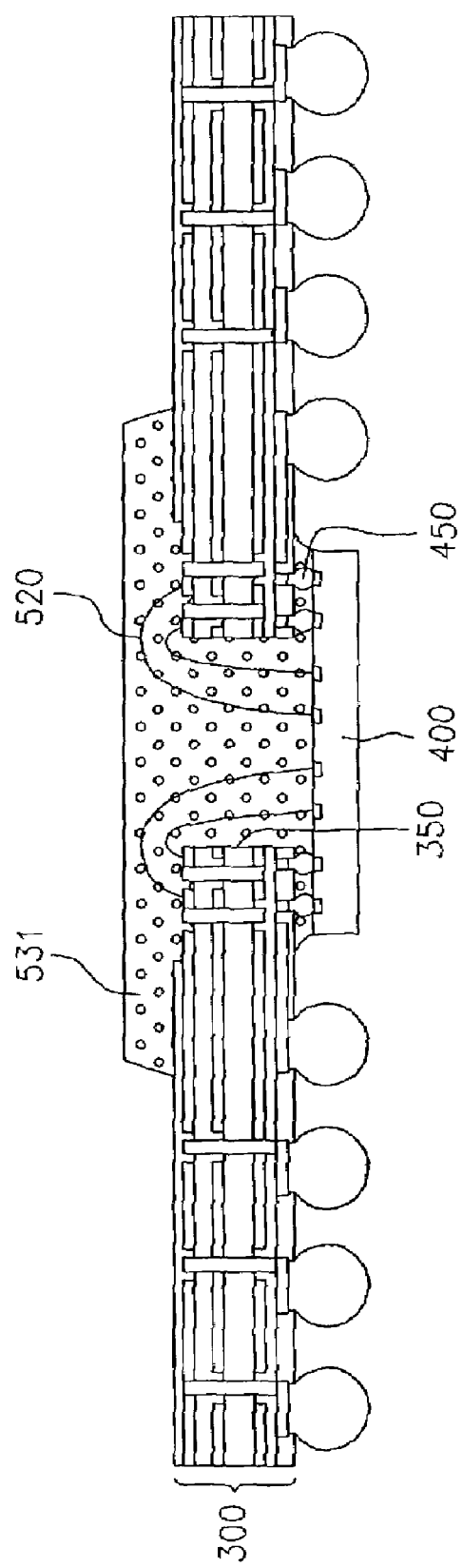
FIG. 5 is a schematic cross-sectional view of a chip package module according to a third preferred embodiment of this invention.
Figure 6:
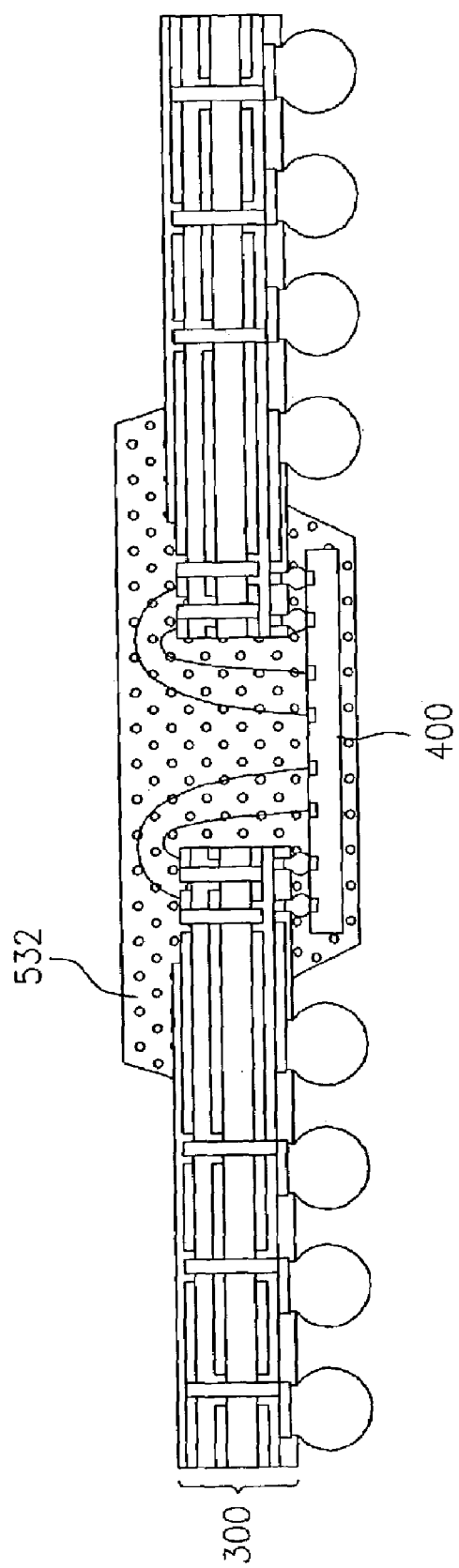
FIG. 6 is a schematic cross-sectional view of a chip package module according to a fourth preferred embodiment of this invention.

In the first embodiment, a two-step process is used to form the insulating layer 510 and the insulating layer 530 for protecting the bumps and the conductive wires. However, a single process can be used to form a single insulating material. FIG. 5 is a schematic cross-sectional view of a chip package module according to a third preferred embodiment of this invention. As shown in FIG. 5, instead of filling the space between the chip 400 and the substrate 300 with an insulating material, a wire bonding process is performed after attaching the bumps 450 on the chip 400 to the substrate 300. Thereafter, an insulating material 531 is injected to fill the slot 350 and the space between the chip 400 and the substrate 300 by a molding process so that the conductive wires 520 and the bumps 450 are enclosed in a single step. FIG. 6 is a schematic cross-sectional view of a chip package module according to a fourth preferred embodiment of this invention. Alternatively, as shown in FIG. 6, the chip 400 can be further enclosed in the insulating material 531 depending on design choices.

Figure 7:
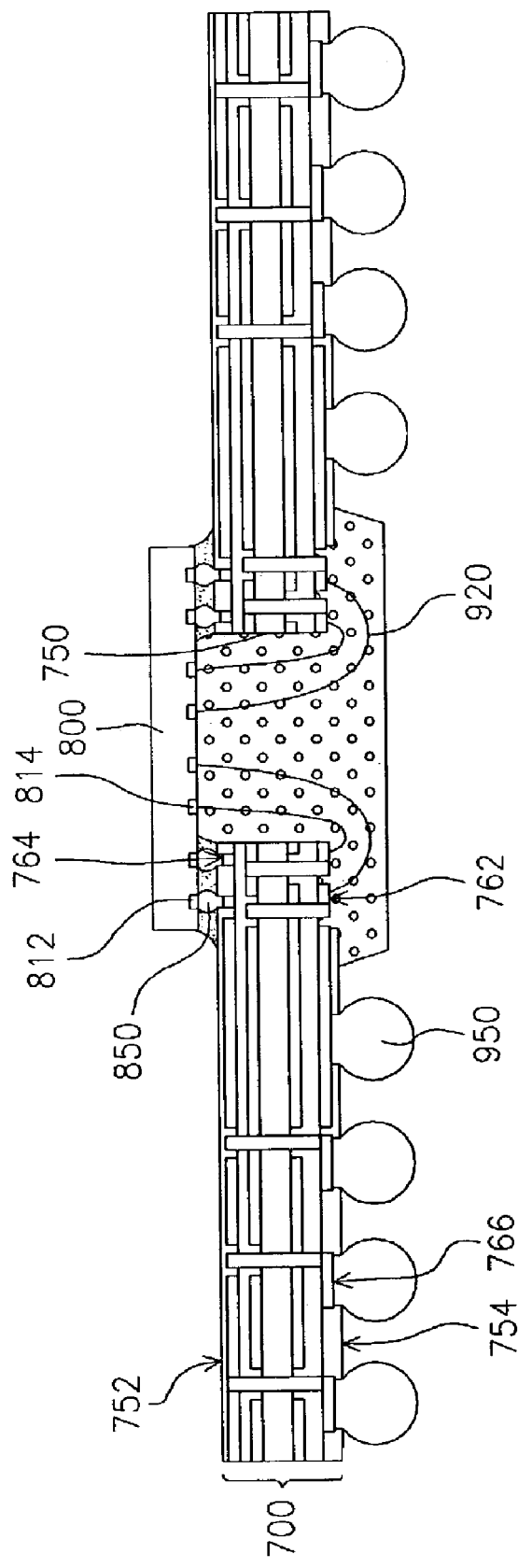
FIG. 7 is a schematic cross-sectional view of a chip package module according to a fifth preferred embodiment of this invention.

In the first embodiment, the chip and the contacts are positioned on the same side of the substrate. In other words, both the chip and the contacts are on the first surface of the substrate. In practice, the chip and the contacts can be positioned on each side of the substrate. FIG. 7 is a schematic cross-sectional view of a chip package module according to a fourth preferred embodiment of this invention.

Figure 8:
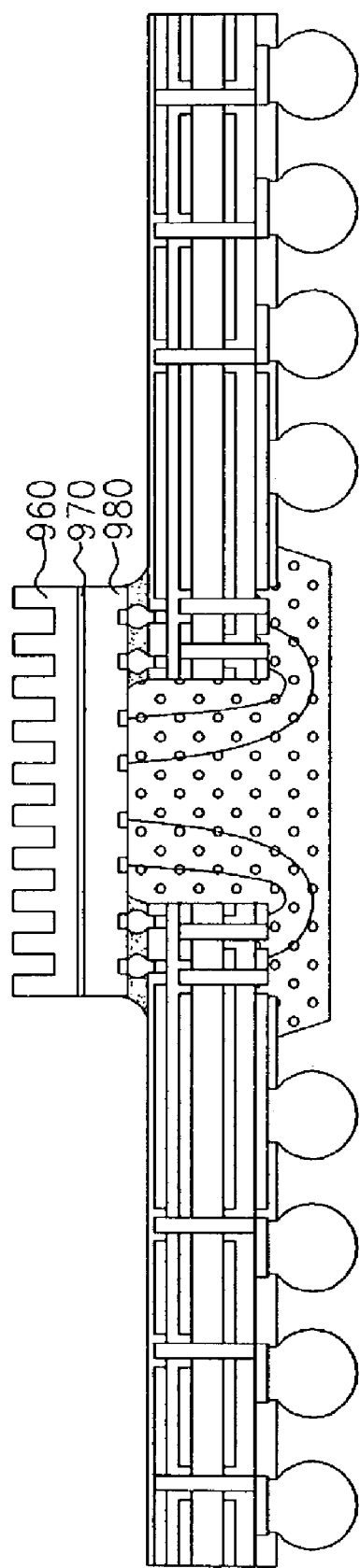
FIG. 8 is a schematic cross-sectional view of a chip package module according to a sixth preferred embodiment of this invention.

As shown in FIG. 7, a substrate 700 is provided. The substrate 700 comprises a plurality of substrate wire pads 762, a plurality of substrate bump pads 764 and a plurality of substrate contact pads 766. The substrate bump pads 764 are formed on the first surface 752 of the substrate 700 around the slot 750. The substrate wire pads 762 are formed on the second surface 754 of the substrate 700 around the slot 750. The substrate contact pads 766 are also formed on the second surface 754 of the substrate. The bumps 850 attached to the chip bump pads 812 of a chip 800 are connected to the substrate bump pads 764 on the substrate 700. A plurality of conductive wires 920 passes through the slot 750 in the substrate 700 such that one end of each conductive wire 920 is attached to a chip wire pad 814 and the other end is attached to a corresponding substrate wire pad 762. A contact 950 including, for example, a solder ball, a pin or an electrode bump is attached to each substrate contact pad 766. In brief, the chip 800 is positioned on the first surface 752 of the substrate 700 while the contacts 950 are positioned on the second surface 754 of the substrate 700. FIG. 8 is a schematic cross-sectional view of a chip package module according to a sixth preferred embodiment of this invention. Alternatively, as shown in FIG. 8, a heat sink 960 can be arranged on the back side of the chip 800 by an adhesive 970.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip package structure, comprising:
  a substrate having a first surface and a corresponding second surface, wherein the substrate has a slot that penetrates the substrate, the substrate having a plurality of substrate bump pads on the first surface positioned around the slot, a plurality of substrate contact pads on the first surface positioned around the slot, and a plurality of substrate wire pads on the second surface positioned around the slot;
  a chip having an active surface, wherein the sectional area of the active surface is larger than the sectional area of the slot in the substrate, the chip is attached to the first surface of the substrate and covers the slot such that the active surface faces the slot, the chip futhermore has a plurality of chip bump pads and a plurality of chip wire pads, wherein the chip wire pads are formed in the central region of the active surface and the chip bump pads are formed in the peripheral region of the active surface;
  a plurality of bumps, wherein one end of each bump is attached to a chip bump pad and the other end of the bump is attached to a substrate bump pad;
  a plurality of conductive wires that passes through the slot in the substrate, wherein one end of each conductive wire is attached to a chip wire pad and the other end is attached to a substrate wire pad;
  an insulating material formed between the chip and the substrate and inside the slot so that the conductive wires and the bumps are enclosed; and
  a plurality of contacts attached to the substrate contact pads on the first surface respectively, and electrically connected to circuits within the substrate so that the substrate is electrically connected to external circuits through the contacts, wherein the contacts are conductive structures selected from the group consisted of solder balls, pins, or electrode bumps.

2. The chip package structure of claim 1, wherein high frequency signals are transmitted between the chip and the substrate through a pathway that includes the substrate bump pads, the bumps and the chip bump pads.

3. The chip package structure of claim 1, wherein the substrate is fabricated using a lamination process.

4. The chip package structure of claim 1, wherein the structure furthermore comprises a heat sink attached to the insulation material layer or to the chip.

5. A chip package structure, at least comprising:
  a substrate having a first surface and a corresponding second surface, wherein the substrate has a slot that penetrates the substrate;
  a chip attached to the first surface of the substrate and covering the slot;
  a plurality of bumps connecting the chip to the first surface of the substrate;
  a plurality of conductive wires that passes through the slot in the substrate, wherein one end of each conductive wire is attached to a contact point on the chip and the other end is attached to a contact point on the second surface of the substrate;
  an insulating material formed between the chip and the substrate and inside the slot such that the conductive wires and the bumps are enclosed; and
  a plurality of contacts attached to the first surface of the substrate and electrically connected to circuits within the substrate so that the substrate is electrically connected to external circuits through the contacts, wherein the contacts are conductive structures selected from the group consisted of solder balls, pins, or electrode bumps.

6. The chip package structure of claim 5, wherein high frequency signals are transmitted between the chip and the substrate through the bumps.

7. The chip package structure of claim 5, wherein the substrate is fabricated using a lamination process.

8. The chip package structure of claim 5, wherein the structure furthermore comprises a heat sink attached to the insulating material or to the chip.

* * * * *